United States Patent [19]

Nogle et al.

[11] Patent Number: 4,964,083

[45] Date of Patent: Oct. 16, 1990

[54] NON-ADDRESS TRANSITION DETECTION MEMORY WITH IMPROVED ACCESS TIME

[75] Inventors: Scott G. Nogle; Stephen T. Flannagan, both of Austin, Tex.

[73] Assignee: Motorola, Inc., Schaumburg, Ill.

[21] Appl. No.: 344,200

[22] Filed: Apr. 27, 1989

[51] Int. Cl.⁵ .............................................. G11C 7/00
[52] U.S. Cl. ................................. 365/189.11; 365/208
[58] Field of Search ................... 365/189.11, 207, 208, 365/209, 210; 307/530

[56] References Cited

U.S. PATENT DOCUMENTS

4,485,319 11/1984 Davies et al. ...................... 307/530
4,583,203 4/1986 Monk .............................. 365/189.11
4,910,713 3/1990 Madden et al. ................. 365/189.11

Primary Examiner—James W. Moffitt
Attorney, Agent, or Firm—James C. Clingan, Jr.; Paul J. Polansky

[57] ABSTRACT

A memory which senses output signals from a selected memory cell during a read cycle using a non-address transition detection apparatus. The memory has a plurality of memory cells which provide signals to a pair of bit lines when selected. An input circuit drives word lines and select a bit line pair of a memory cell located at the intersection of a selected word line and a selected bit line pair. The memory cell outputs bit line signals which are sensed by a combination of a differential amplifier, a level shifter, and a transconductance amplifier, and are thereafter output and presented externally at a logic state representative of a differential current at outputs of the transconductance amplifier. The combination sensing apparatus and a method for constructing such an apparatus decrease access time significantly over a prior art memory using address transition detection.

10 Claims, 5 Drawing Sheets

NON-ADDRESS TRANSITION DETECTION MEMORY WITH IMPROVED ACCESS TIME

FIELD OF THE INVENTION

This invention relates generally to integrated circuit memories, and more particularly, to static random access memories which do not use address transition detection.

BACKGROUND OF THE INVENTION

Static random access memories designed as integrated circuits require increasingly short access times to stay commercially competitive. One method that has been used to decrease access times has been address transition detection, or ATD. (See, for example, Gubbels, W. et al., "A 40-ns/100-pF Low Power Full-CMOS 256K (32K×8) SRAM," *IEEE Journal of Solid-State Circuits*, vol. 22, no. 5, Oct. 1987; Matsui, M. "A 25-ns 1-Mbit CMOS SRAM with Loading-Free Bit Lines," *IEEE Journal of Solid-State Circuits*, vol. 22, no. 5, Oct. 1987; Wang, K. et al., "A 21-ns 32K×8 CMOS Static RAM with a Selectively Pumped p-Well Array," *IEEE Journal of Solid-State Circuits*, vol. 22, no. 5, Oct. 1987.) ATD allows a memory access to begin as soon as a change in an address is detected. ATD is especially useful in improving memory access time in a memory with long bit lines. With short bit lines, however, ATD no longer provides a speed advantage.

An ATD memory access comprises the stages of equalization, word line driving, bit line driving, data line sensing, and outputting. A built-in limitation of ATD is that it contains the equalization stage, in which nodes must be precharged before the access begins. In order to further speed up static random access memories, a new technique not relying on ATD's equalization stage and minimizing the time from a valid address to a valid word line is needed. Merely eliminating ATD and the equalization stage creates a problem, however. The problem is that amplifiers work well with ATD by providing a high voltage gain and a large differential output signal, but that the data line amplifiers are relatively slow when ATD is not used. An improvement in access time of the memory would be realized if the equalization of the ATD method could be eliminated while retaining rapid sensing and output signal development, a scenario in which only the stages of word line driving, bit line driving, sensing, and outputting remain.

BRIEF DESCRIPTION OF THE INVENTION

Accordingly, it is an object of the present invention to provide a memory with an improved access time using a non-address transition detection data line sensing apparatus.

It is another object of the present invention to provide a method of sensing a data line in a non-address transition detection memory for improved access time.

In carrying out these and other objects of the invention, there is provided, in one form, a memory having a plurality of memory cells arranged in blocks. When a block is selected during a read cycle, a row decoder and a column decoder drive signals that select four memory cells located at intersections of selected word lines and selected bit line pairs. The memory cells output bit line pairs which are sensed by a combination of a differential amplifier, a level shifter, and a transconductance amplifier, and are thereafter output on global data lines and presented externally. The combination sensing apparatus and a method for constructing such an apparatus decrease access time significantly over a prior art memory.

These and other objects, features and advantages will be more clearly understood from the following detailed description taken in conjunction with the accompanying drawings.

DETAILED DESCRIPTION OF THE INVENTION

Figure 1:
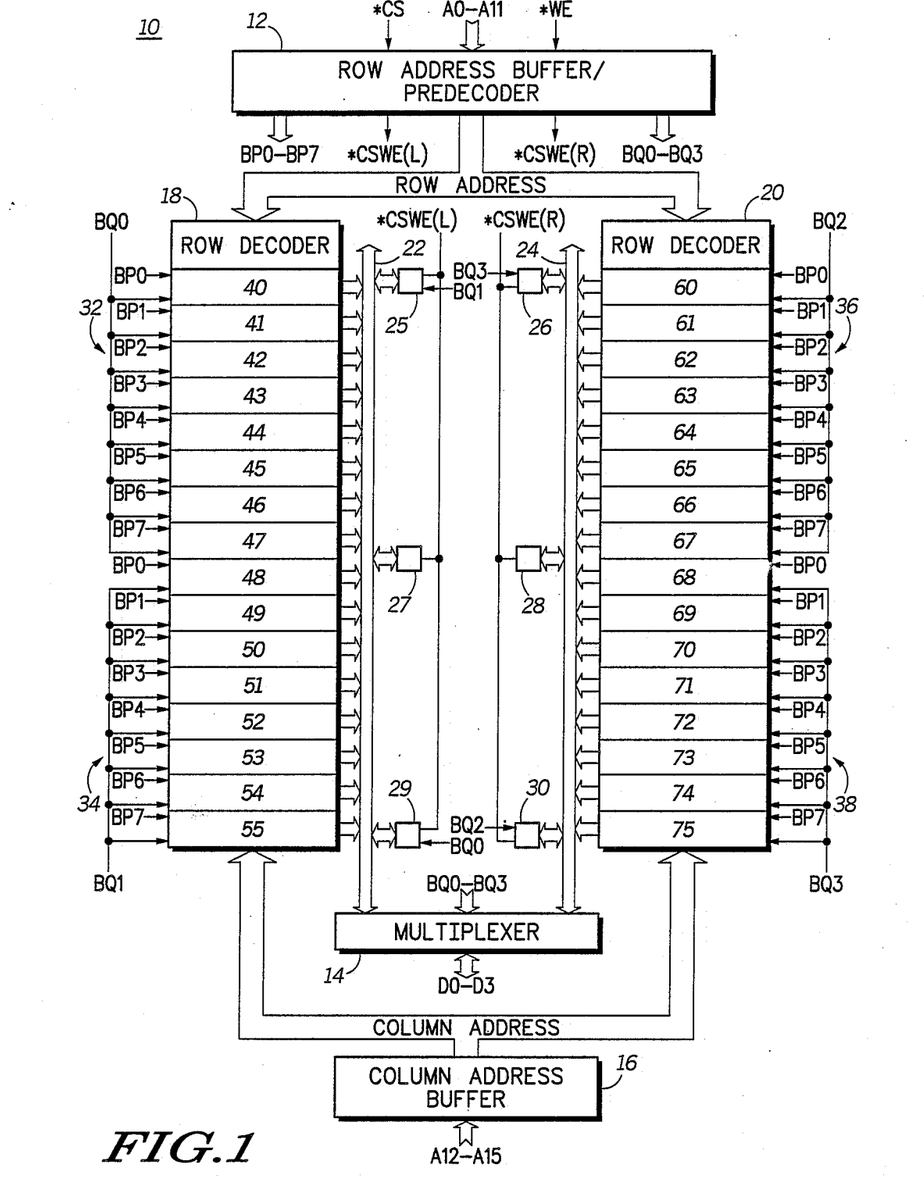
FIG. 1 illustrates in block form a memory in accordance with the present invention.

Shown in the FIG. 1 is a memory 10 generally comprising a row address buffer/predecoder 12, a multiplexer 14, a column address buffer 16, a first row decoder 18, a second row decoder 20, a first set of global data lines 22, a second set of global data lines 24, global data line load sets 25, 26, 27, 28, 29, and 30, a first array 32, a second array 34, a third array 36, and a fourth array 38. First set of global data lines 22 comprises four global data line pairs, each pair including a true global data line and a complementary global data line. Second set of global data lines 24 comprises four global data line pairs, each pair including a true global data line and a complementary global data line. First array 32 comprises memory blocks 40, 41, 42, 43, 44, 45, 46, and 47. Second array 34 comprises memory blocks 48, 49, 50, 51, 52, 53, 54, and 55. Third array 36 comprises memory blocks 60, 61, 62, 63, 64, 65, 66, and 67. Fourth array 38 comprises memory blocks 68, 69, 70, 71, 72, 73, 74, and 75.

Row address buffer/predecoder 12 receives row address signals A0, A1, A2, A3, A4, A5, A6, A7, A8, A9, A10, and A11, chip select signal *CS, and write mode signal *WE. Row address buffer/predecoder 12 provides memory block select signals BP0, BP1, BP2, BP3, BP4, BP5, BP6, and BP7, chip select/write signals *CSWE(L) and *CSWE(R), array select signals BQ0, BQ1, BQ2, and BQ3, and a buffered row address signal. An asterik (*) in front of a signal designation indicates that that signal is active at a logic low. Column address buffer 16 receives column address signals A12, A13, A14, and A15, and outputs a buffered column address. Multiplexer 14 receives signals BQ0-BQ3 and is coupled to sets of global data lines 22 and 24. In a read mode of memory 10, multiplexer 14 receives global data line signals GDL(0) and *GDL(0), GDL(1) and *GDL(1), GDL(2) and *GDL(2), and GDL(3) and *GDL(3) from first set of global data lines 22, and global data line signals GDL(4) and *GDL(4), GDL(5) and *GDL(5), GDL(6) and *GDL(6), and GDL(7) and *GDL(7) from second set of global data lines 24. Multiplexer 14 outputs data signals D0, D1, D2, and D3 in the read mode, and receives data input signals D0-D3 in a write mode of memory 10. First row decoder 18 receives the buffered row address and selectively provides 64 global word line driver signals and a buffered row address signal to memory blocks 40-55. Second row decoder 20 receives the buffered row address and selectively provides 64 global word line driver signals and a buffered row address signal to memory blocks 60-75.

Array 32 is located immediately above array 34, and to the left of arrays 36 and 38. Memory blocks within array 32 are placed sequentially below one another, with memory block 40 at the top of array 32, memory block 41 below memory block 40, etc. Memory block 47 is at the bottom of array 32. Memory blocks within array 34 are placed sequentially below one another, with memory block 48 at the top of array 34, memory block 49 below memory block 48, etc. Memory block 55 is at the bottom of array 34. Array 36 is located immediately above array 38. Memory blocks within array 36 are placed sequentially below one another, with memory block 60 at the top of array 36, memory block 61 below memory block 60, etc. Memory block 67 is at the bottom of array 36. Memory blocks within array 38 are placed sequentially below one another, with memory block 68 at the top of array 38, memory block 69 below memory block 68, etc. Memory block 75 is at the bottom of array 38. First set of global data lines 22 begins at the top of array 32 and runs below the bottom of array 34, where it connects with multiplexer 14. Second set of global data lines 24 begins at the top of array 36 and runs below the bottom of array 38, where it connects with multiplexer 14.

Global data line load set 25 connects to first set of global data lines 22 at the top of array 32. Below global data line load set 25 memory blocks 40-47 in first array 32 connect to first set of global data lines 22. Below first array 32 global data line load set 27 connects to first set of global data lines 22. Below global data line load set 27 memory blocks 48-55 in second array 34 connect to first set of global data lines 22. Below second array 34 global data line load set 29 connects to first set of global data lines 22. Multiplexer 14 connects to first set of global data lines 22. In the read mode, multiplexer 14 receives signals GDL(0)/*GDL(0)-GDL(3)/*GDL(3) on the four global data line pairs contained in first set of global data lines 22.

Global data line load set 26 connects to second set of global data lines 24 at the top of array 36. Below global data line load set 26 memory blocks 60-67 in third array 36 connect to second set of global data lines 24. Below third array 36 global data line load set 28 connects to second set of global data lines 24. Below global data line load set 28 memory blocks 48-55 in fourth array 38 connect to second set of global data lines 24. Below fourth array 38 global data line load set 30 connects to second set of global data lines 24. Multiplexer 14 connects to second set of global data lines 24. In the read mode, multiplexer 14 receives signals GDL(4)/*GDL(4)-GDL(7)/*GDL(7) on the four global data line pairs contained in second set of global data lines 24.

Global data line load set 25 receives array select signal BQ1 and chip select/write signal *CSWE(L). Global data line load set 27 receives chip select/write signal *CSWE(L). Global data line load set 29 receives array select signal BQ0 and chip select/write signal *CSWE(L). Global data line load set 26 receives array select signal BQ3 and chip select/write signal *CSWE(R). Global data line load set 28 receives chip select/write signal *CSWE(R). Global data line load set 30 receives array select signal BQ2 and chip select/write signal *CSWE(R).

Array 32 is selected when signal BQ0 is a logic high. One of memory blocks 40-47 is selected when array 32 is selected. The particular memory block 40-47 within array 32 which is selected is selected when its corresponding signal of signals BP0-BP7 is a logic high. In array 32, memory blocks 40-47 connect to first row decoder 18 and to column address buffer 16. Memory blocks 40-47 receive memory block select signals BP0-BP7, respectively. Each of memory blocks 40-47 receives array select signal BQ0 form row address buffer/decoder 12, and has four data output pairs coupled to first set of global data lines 22. In the read mode, a selected memory block provides output signals onto first set of global data lines 22 via the four data output pairs coupled between the selected memory block and first set of global data lines 22. Similarly, in the write mode, multiplexer 14 outputs signals onto the first set of global data lines 22 and the selected memory block reads these signals.

Array 34 is selected when signal BQ1 is a logic high. One of memory blocks 48-55 is selected when array 34 is selected. The particular memory block 48-55 within array 34 which is selected is selected when its corresponding signal of signals BP0-BP7 is a logic high. In array 34, memory blocks 48-55 connect to first row decoder 18 and to column address buffer 16. Memory blocks 48-55 receive memory block select signals BP0-BP7, respectively. Each of memory blocks 48-55 receives array select signal BQ1 from row address buffer/decoder 12, and has four data output pairs coupled to first set of global data lines 22. In the read mode, a selected memory block provides output signals onto first set of global data lines 22 via the four data output pairs coupled between the selected memory block and first set of global data lines 22. Similarly, in the write mode, multiplexer 14 outputs signals onto the first set of global data lines 22 and the selected memory block reads these signals.

Array 36 is selected when signal BQ2 is a logic high. One of memory blocks 60-67 is selected when array 36 is selected. The particular memory block 60-67 within array 36 which is selected is selected when its corresponding signal of signals BP0-BP7 is a logic high. In array 36, memory blocks 60-67 connect to second row decoder 20 and to column address buffer 16. Memory blocks 60-67 receive memory block select signals BP0-BP7, respectively. Each of memory blocks 60-67 receives array select signal BQ2 from row address buffer/decoder 12, and has four data output pairs coupled to second set of global data lines 24. In the read mode, a selected memory block provides output signals onto second set of global data lines 24 via the four data output pairs coupled between the selected memory block and second set of global data lines 24. Similarly, in the write mode, multiplexer 14 outputs signals onto the second set of global data lines 24 and the selected memory block reads these signals.

Array 38 is selected when signal BQ3 is a logic high. One of memory blocks 68-75 is selected when array 38 is selected. The particular memory block 68-75 within array 38 which is selected is selected when its corresponding signal of signals BP0-BP7 is a logic high. In array 38, memory blocks 68-75 connect to second row decoder 20 and to column address buffer 16. Memory blocks 68-75 receive memory block select signals BP0–BP7, respectively. Each of memory blocks 68–75 receives array select signal BQ3 from row address buffer/decoder 12, and has four data output pairs coupled to second set of global data lines 24. In the read mode, a selected memory block provides output signals onto second set of global data lines 24 via the four data output pairs coupled between the selected memory block and second set of global data lines 24. Similarly, in the write mode, multiplexer 14 outputs signals onto the second set of global data lines 24 and the selected memory block reads these signals.

In operation, memory 10 allows memory cells located within memory blocks 40–55 and 60–75 to be read from and written to. During write cycles, multiplexer 14 receives data signals D0–D3 and supplies them to the appropriate memory block based on the address A0–A15. In a write mode, when a memory block on a left side of memory 10 comprising blocks in arrays 32 or 34 is being written to, *CSWE(L) is low and global data line load sets 25, 27, and 29 are disabled. Global data line load sets 26, 28, and 30 are enabled, however, to prevent the second set of global data lines from assuming an indeterminate state. When a memory block on a right side of memory 10 is being written to, *CSWE(R) is low and global data line load sets 26, 28, and 30 are disabled. Global data line load sets 25, 27, and 29 are enabled, however, to prevent the first set of global data lines from assuming an indeterminate state.

In the read mode, memory 10 provides four bits of data represented by data signals D0–D3 selected by address signals A0–A15. Column address buffer 16 buffers incoming address signals A12–A15 and outputs them to memory blocks 40–55 and 60–75. Row address buffer/predecoder 12 decodes row address lines A0–A11, chip select signal *CS, and write mode signal *WE. In response, it supplies signals BP0–BP7, BQ0–BQ3, *CSWE(L) and *CSWE(R), and a row address to row decoders 18 and 20. Signals BP0–BP7 select one of eight memory blocks of each array 32, 34, 36, and 38. Signals BQ0–BQ3 select which one of the four arrays 32, 34, 36, and 38 is selected. Together, signals BP0–BP7 and signals BQ0–BQ3 select one memory block of 32 memory blocks of the set 40–55 and 60–75. *CSWE(L) is true if both *CS and *WE are true and a left side comprising arrays 32 and 34 is selected, and indicates that memory 10 is in the write mode, that memory 10 is active, and that the global data line loads connected to first set of global data lines 22 should be disabled. *CSWE(R) is true if both *CS and *WE are true and a right side comprising arrays 36 and 38 is selected, and indicates that memory 10 is in the write mode, that memory 10 is active, and that the global data line loads connected to second set of global data lines 24 should be disabled.

The buffered row address is input to first row decoder 18 and second row decoder 20. In response to receiving the buffered row address, first row decoder 18 drives 64 global word lines to memory blocks 40–55 and second row decoder 20 drives 64 global word lines to memory blocks 60–75. The word lines, along with the column address and the buffered row address signal, are further decoded in the memory blocks themselves. After a particular memory block is selected by BP0–BP7 and BQ0–BQ3, the memory block combines the 64 global word lines and the buffered row address signal and drives 128 local word lines. The memory block decodes the column address along with the selected word line and selects one memory cell for each of four pairs of global data lines. The four memory cells output four data bits and the complements of the four data bits onto the first set of global data lines 22 if the memory block selected is located in either first array 32 or second array 34, or outputs four data bits and the complements of the four data bits onto the second set of global data lines 24 if the memory block selected is located in first array 36 or second array 38. Multiplexer 14 receives signals GDL(0)/*GDL(0)–GDL(3)/*GDL(3) from first set of global data lines 22 and signals GDL(4)/*GDL(4)–GDL(7)/*GDL(7) from second set of global data lines 24 and forms and buffers outputs D0–D3 in response. Multiplexer 14 receives signals BQ0–BQ3 and in response derives D0–D3 from signals GDL(0)/*GDL(0)–GDL(3)/*GDL(3) if a memory block in the first array 32 or second array 34 is selected by BQ0 or BQ1, respectively, or from signals GDL(4)/*GDL(4)–GDL(7)/*GDL(7) if a memory block in the third array 36 or fourth array 38 is selected by BQ2 or BQ3, respectively.

When a read access takes place, a selected memory block outputs signals on four global data line pairs. Each global data line pair appears as a pair of transmission lines. The selected memory block outputs signals on each long transmission line using a differential transconductance amplifier, which receives a sensed differential voltage from a selected memory cell and outputs a differential current in response. The global data line loads source the current and thereby convert the output of the transconductance amplifiers to a voltage, so that the signals GDL(0)/*GDL(0)–GDL(7)/*GDL(7) form eight differential voltage pairs.

The particular global data line load sets selected depends on which array contains a memory block which is selected. If first array 32 or second array 34 is selected during a read access, signal *CSWE(L) is high. During a memory access in which *CSWE(L) is high, global data line load set 27 is always selected. Which one of global data line load set 25 and global data line load set 29 is selected is determined by whether a memory block in first array 32 or second array 34 is selected. If a memory block in first array 32 is selected, BQ0 is high, BQ1–BQ3 are low, global data line load set 25 is enabled, and global data line load set 29 is disabled. If a memory block in second array 34 is selected, BQ1 is high, BQ0 and BQ2–BQ3 are low, global data line load set 29 is enabled, and global data line load set 25 is disabled.

Similarly, if third array 36 or fourth array 38 is selected during a read access, signal *CSWE(R) is high. During a memory access in which *CSWE(R) is high, global data line load set 28 is always selected. Which of global data line load set 26 and global data line load set 30 is selected is determined by whether a memory block in third array 36 or fourth array 38 is selected. If a memory block in third array 36 is selected, BQ2 is high, BQ0, BQ1, and BQ3 are low, global data line load set 26 is enabled, and global data line load set 30 is disabled. If a memory block in fourth array 38 is selected, BQ3 is high, BQ0–BQ2 are low, global data line load set 30 is enabled, and global data line load set 26 is disabled.

Figure 2:
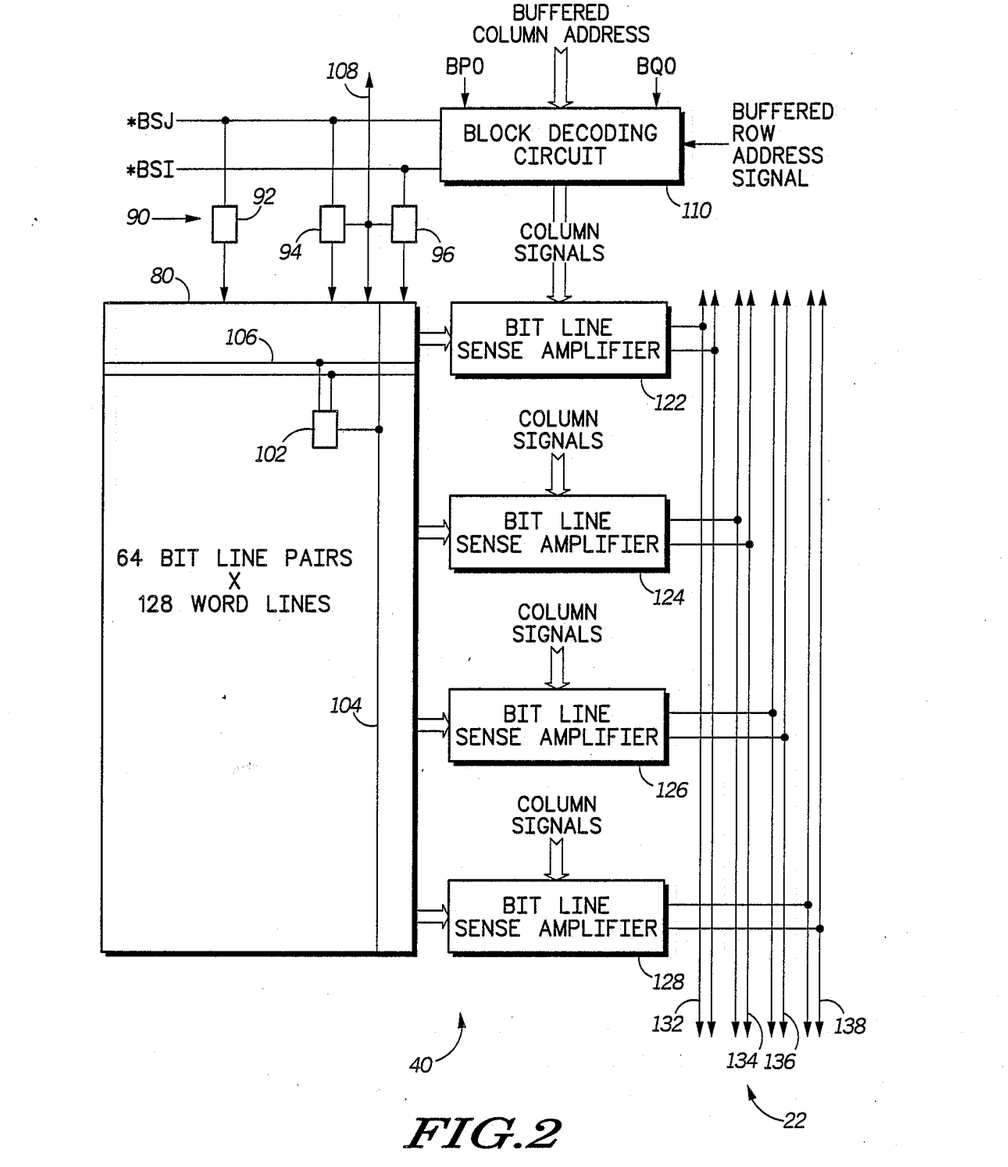
FIG. 2 illustrates a block diagram of a memory block of the type shown in FIG. 1 in greater detail.

FIG. 2 shows memory block 40 of FIG. 1 in greater detail. Elements which are common between FIG. 2 and FIG. 1 are similarly numbered for convenience of illustration. Memory block 40 generally comprises a memory array 80, a set of word line drivers 90, a block decoding circuit 110, a first bit line sense amplifier 122, a second bit line sense amplifier 124, a third bit line sense amplifier 126, a fourth bit line sense amplifier 128, and first set of global data lines 22. Set of word line drivers 90 is comprised of 128 individual word line drivers. Of these, a word line driver 92, a word line driver 94, and a word line driver 96 are shown in FIG. 2. Only three have been shown for ease of illustration. First set of global data lines 22 further comprises a global data line pair 132, a global data line pair 134, a global data line pair 136, and a global data line pair 138.

Memory array 80 comprises memory cells located at intersections of 128 word lines and 64 bit line pairs. A memory cell 102, a word line 104, and a bit line pair 106 are shown as an example. Set of word line drivers 90 is connected to the 128 word lines of memory array 80. A first sixteen pairs of bit lines are connected to bit line sense amplifier 122. A second sixteen pairs of bit lines are connected to bit line sense amplifier 124. A third sixteen pairs of bit lines are connected to bit line sense amplifier 126. A fourth sixteen pairs of bit lines are connected to bit line sense amplifier 128.

Block decoding circuit 110 receives the buffered column address, a buffered row address signal, memory block select signal BP0, and array select signals BQ0. Block decoding circuit 110 provides a decoded row address signal *BSI and a decoded row address signal *BSJ to word line driver set 90. Block decoding circuit 110 provides decoded column signals to bit line sense amplifier 122, bit line sense amplifier 124, bit line sense amplifier 126, and bit line sense amplifier 128. Bit line sense amplifier 122 provides a first pair of global data line signals to pair of global data lines 132. Bit line sense amplifier 124 provides a second pair of global data line signals to pair of global data lines 134. Bit line sense amplifier 126 provides a third pair of global data line signals to pair of global data lines 136. Bit line sense amplifier 128 provides a fourth pair of global data line signals to pair of global data lines 138.

Word line driver 92 receives decoded row address signal *BSJ, and drives a first word line in memory array 80. Word line driver 92 also connects to a global word line not shown. Word line driver 94 receives decoded row address signal *BSJ, connects to global word line 108, and drives a first word line in memory array 80. Word line driver 96 receives decoded row address signal *BSI, connects to global word line 108, and drives a second word line in memory array 80. Other word line drivers not shown connect to either *BSI or *BSJ in an alternating fashion such that each of the 64 global word lines connects to two word line drivers, one which also connects to decoded row address signal *BSI and one which also connects to decoded row address signal *BSJ. The other word line drivers also drive other word lines in memory array 80.

Memory cell 102 has an input for receiving a first signal from word line 104, and two complementary outputs for connecting to bit line pair 106. Memory cell 102 is an example of a multiplicity of memory cells contained in memory array 80, in which each intersection of 128 word lines and 64 bit line pairs contains one memory cell. Similarly, word line 104 is typical of the 128 word lines, and bit line pair 106 is typical of the 64 bit line pairs, contained in memory array 80.

In operation, block decoding circuit 110 outputs decoded column signals in response to the buffered column address, and decoded row address signals *BSI and *BSJ in response to the buffered row address signal, when selected by signals BP0 and BQ0. The decoded column address selects one pair of bit lines to amplify onto a corresponding pair of global data lines. Bit line sense amplifiers 122, 124, 126, and 128 each amplify one of sixteen bit line pairs and output them onto pairs of global data lines 132, 134, 136, and 138, respectively. Row decoder 18 of FIG. 1 drives one global word line of a set of 64 global word lines in response to the row address. Each global word line connects to two word line drivers in each memory block. Row address signals *BSI and *BSJ from block decoding circuit 110 further select one word line driver out of two connected to a selected global word line. Together row decoder 18 and block decoding circuit 110 select one word line of 128 word lines in memory array 80. For example, if row decoder 18 selects global word line 108, and if decoded row address signal *BSI is low, word line driver 96 is active and drives its corresponding word line in memory array 80.

A selected word line driver drives a word line to 64 memory cells located on that word line. Memory array 80 in response outputs 64 complementary signals on bit line pairs. Each bit line sense amplifier 122, 124, 126, and 128 receives sixteen pairs. Bit line sense amplifiers 122, 124, 126, and 128 receive the fully decoded column address, and each outputs one complementary pair of global data line signals onto global data line pairs 132, 134, 136, and 138, respectively, in response to the fully decoded column address.

Figure 3:
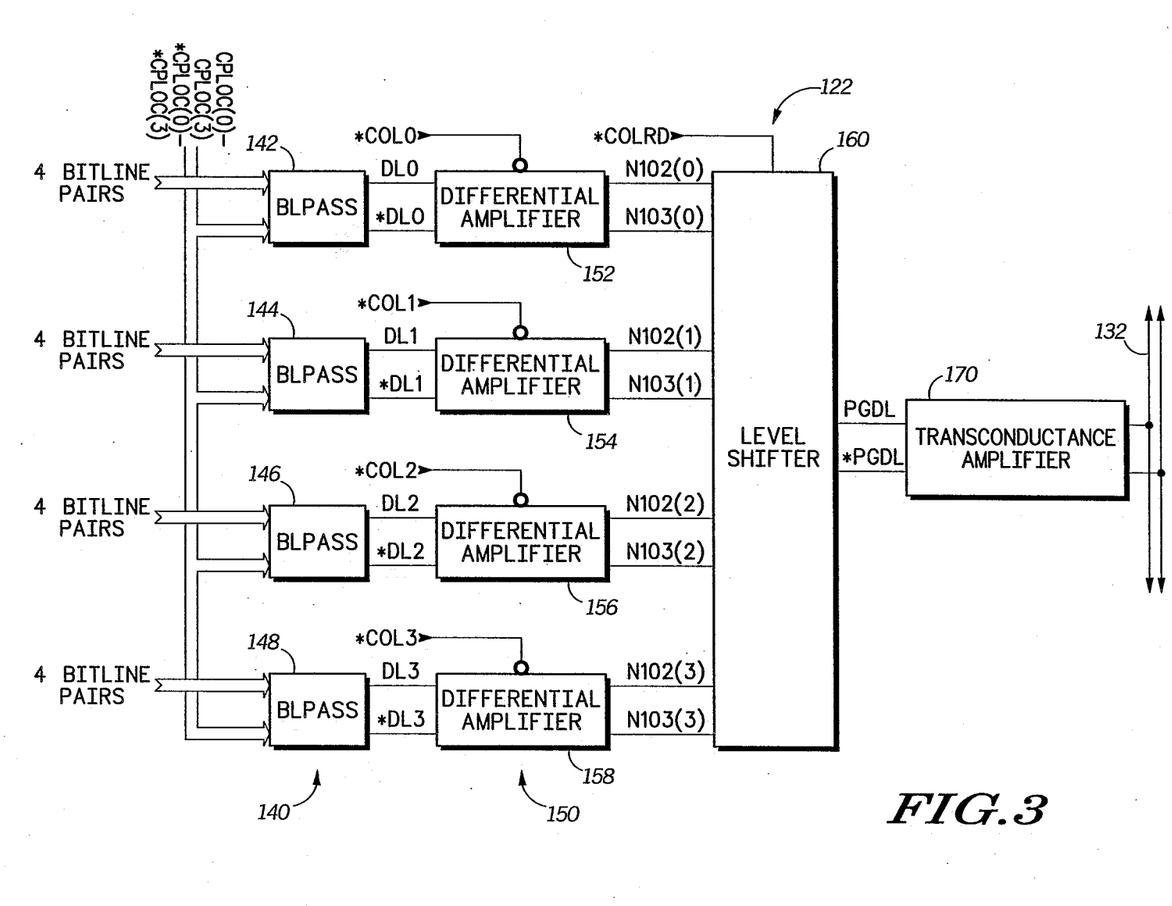
FIG. 3 illustrates in block form a portion of the memory block of FIG. 2.

FIG. 3 shows bit line sense amplifier 122 in greater detail. Bit line sense amplifier 122 generally comprises a bit line pass set 140, a differential amplifier set 150, a level shifter 160, and a transconductance amplifier 170. Bit line pass set 140 further comprises bit line pass block 142, bit line pass block 144, bit line pass block 146, and bit line pass block 148. Differential amplifier set 150 further comprises differential amplifier 152, differential amplifier 154, differential amplifier 156, and differential amplifier 158.

The present invention comprises an apparatus for receiving complementary signals from bit line pass blocks 142, 144, 146, and 148, and sensing and amplifying them onto pair of global data lines 132. The apparatus for doing so improves access time of the memory 10 over a prior art implementation.

Each of bit line pass blocks 142, 144, 146, and 148 receives decoded column signals CPLOC0 and *CPLOC0, CPLOC1 and *CPLOC1, CPLOC2 and *CPLOC2, and CPLOC3 and *CPLOC3. Each receives four bit line pairs from memory array 80 of FIG. 2. Bit line pass block 142 receives a first four bit line pairs from memory array 80 in FIG. 2 and outputs pair of data line signals DL0 and *DL0 to differential amplifier 152. Bit line pass block 144 receives a second four bit line pairs from memory array 80 in FIG. 2 and outputs pair of data line signals DL1 and *DL1 to differential amplifier 154. Bit line pass block 146 receives a third four bit line pairs from memory array 80 in FIG. 2 and outputs pair of data line signals DL2 and *DL2 to differential amplifier 156. Bit line pass block 148 receives a fourth four bit line pairs from memory array 80 in FIG. 2 and outputs pair of data line signals DL3 and *DL3 to differential amplifier 158. Collectively, bit line sense amplifier 122 receives the first sixteen bit line pairs from memory array 80 of FIG. 2.

Differential amplifier 152 receives data line signals DL0 and *DL0 and decoded column signal *COL0, and outputs differential amplified signals N102(0) and N103(0) to level shifter 160. Differential amplifier 154 receives data line signals DL1 and *DL1 and decoded column signal *COL1, and outputs differential amplified signals N102(1) and N103(1) to level shifter 160. Differential amplifier 156 receives data line signals DL2 and *DL2 and decoded column signal *COL2, and outputs differential amplified signals N102(2) and N103(2) to level shifter 160. Differential amplifier 158 receives data line signals DL3 and *DL3 and decoded column signal *COL3, and outputs differential amplified signals N102(3) and N103(3) to level shifter 160.

Level shifter 160 receives N102(0), N103(0), N102(1), N103(1), N102(2), N103(2), N102(3), N103(3), and a decoded column signal *COLRD, and outputs a pair of complementary pre-global data line signals PGDL and *PGDL to transconductance amplifier 170. Transconductance amplifier 170 receives signals PGDL and *PGDL and outputs a pair of complementary global data line signals GDL and *GDL to pair of global data lines 132 of FIG. 2.

In operation, in a read mode of memory 10 of FIG. 1, memory array 80 of FIG. 2 drives one of the 128 word lines across 64 bit line pairs. The 64 bit line pairs provides complementary signals to bit line sense amplifiers 122, 124, 126, and 128. Bit line sense amplifiers 122, 124, 126, and 128 each receive sixteen differential bit line pairs. Column signals received by each bit line sense amplifier further select one bit line, so that each selected memory cell is located at the intersection of a selected word line and a selected bit line. Bit line pass blocks 142, 144, 146, and 148 each receive four bit line pairs.

In bit line pass blocks 142, 144, 146, and 148, decoded column signals CPLOC(0)–CPLOC(3) and *CPLOC(0)–*CPLOC(3) allow each bit line pass block to select one of four pairs of bit lines. Bit line pass blocks 142, 144, 146, and 148 each output one complementary data line pair for each corresponding differential amplifier. A bit line pair selected by signals CPLOC(0)–CPLOC(3) and *CPLOC(0)–*CPLOC(3) passes through a corresponding bit line pass block without amplification. In this way, the complementary data line signals are the same as the complementary bit line signals for the selected bit line pair.

Decoded column signals *COL0–*COL3 select one differential amplifier of differential amplifiers 152, 154, 156, or 158. Only one of decoded column signals *COL0–*COL3 is low, and each of the other three is high, to provide a one-of-four selection. A selected differential amplifier then amplifies a data line pair, DL0 and *DL0, DL1 and *DL1, DL2 and *DL2, or DL3 and *DL3, and presents an amplified differential signal N102(0) and N103(0), N102(1) and N103(1), N102(2) and N103(2), or N102(3) and N103(3) to level shifter 160. Level shifter 160 shifts a common mode voltage of the amplified differential signal and presents pre-global data line signals PGDL and *PGDL to transconductance amplifier 170. The combination of differential amplifier, level shifter, and transconductance amplifier allows non-address transition detection to be used while improving access time over a prior art design.

Transconductance amplifier 170 drives a differential current onto pair of global data lines 132. When the differential current is driven onto pair of global data lines 132, two global data line loads then convert the differential current into a differential voltage for final sensing and outputting. When memory block 40 of FIG. 2 is selected, global data line loads 25 and 27 of FIG. 1 are selected.

Figure 4:
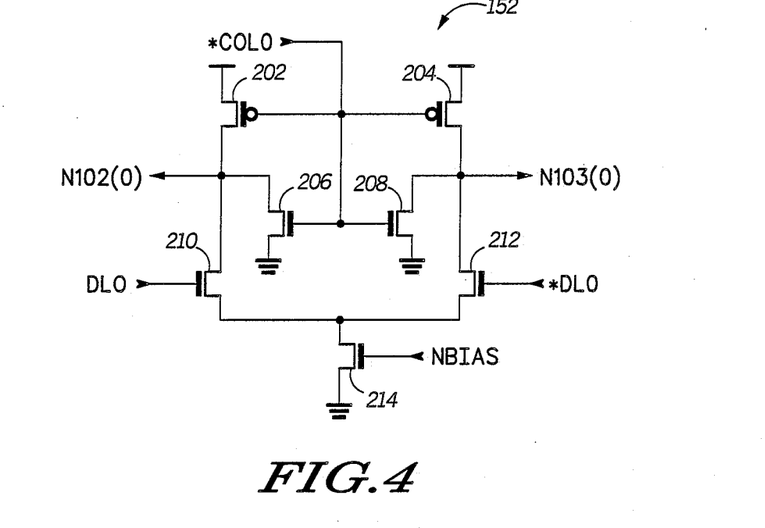
FIG. 4 shows a circuit diagram of a differential amplifier of the type contained in FIG. 3.

FIG. 4 shows a detailed circuit diagram of differential amplifier 152. Differential amplifier 152 comprises a P-channel transistor 202, a P-channel transistor 204, an N-channel transistor 206, an N-channel transistor 208, an N-channel transistor 210, an N-channel transistor 212, and an N-channel transistor 214. Transistor 202 has a source for connecting to a positive power supply $V_{DD}$, a gate for receiving a decoded column signal *COL0, and a drain for providing amplified differential signal N102(0). Transistor 206 has a drain connected to the drain of transistor 202, a gate connected to decoded column signal *COL0, and a source connected to a negative power supply voltage $V_{SS}$. Transistor 210 has a drain for connecting to the drain of transistor 202, a gate for receiving data line signal DL0, and a source. Transistor 214 has a drain connected to the source of transistor 210, a gate for receiving a biasing signal NBIAS, and a source connected to $V_{SS}$.

Transistor 204 has a source connected to $V_{DD}$, a gate is connected to decoded column signal *COL0, and a drain for providing amplified differential signal N103(0). Transistor 208 has a drain connected to the drain of transistor 204, a gate connected to decoded column signal *COL0, and a source connected to $V_{SS}$. Transistor 212 has a drain connected to the drain of transistor 204, a gate connected to data line signal *DL0, and a source connected to the drain of transistor 214.

In operation differential amplifier 152 receives complementary data line signals DL0 and *DL0, and provides a pair of complementary amplified differential signals N102(0) and N103(0) in response thereto. Differential amplifier 152 is selected by decoded column signal *COL0. Only one of four differential amplifiers 152, 154, 156, and 158 of FIG. 3 is selected. When *COL0 is high (i.e., not asserted), transistors 206 and 208 conduct and drive N102(0) and N103(0) to $V_{SS}$ and thus deselect differential amplifier 152. When *COL0 is low, transistors 206 and 208 do not conduct and transistors 202 and 204 conduct and and drive an output on amplified differential signals N102(0) and N103(0).

Biasing signal NBIAS is constant and held at a level to bias N-channel transistor 214 such that N-channel transistor 214 acts as a current source. Sizes for transistors 202 and 204 are chosen such that transistors 202 and 204 operate in a linear region and so operate similar to resistor loads for differential amplifier 152. Signals N102(0) and N103(0) operate between $V_{DD}$ and $V_{DD}$ minus approximately 0.7 volts. Differential amplifier 152 quickly senses a small differential voltage on the data line pair and amplifies the small differential voltage. However a common mode output voltage of differential amplifier 152 is near $V_{DD}$, or $V_{DD}$ minus one half of approximately 0.7 volts. Although differential amplifier 152 is fast, the common mode voltage is too high for further practical amplification. The common mode voltage on the outputs of differential amplifier 152 must be changed into a form which allows further amplification, a function performed by level shifter 160.

Figure 5:
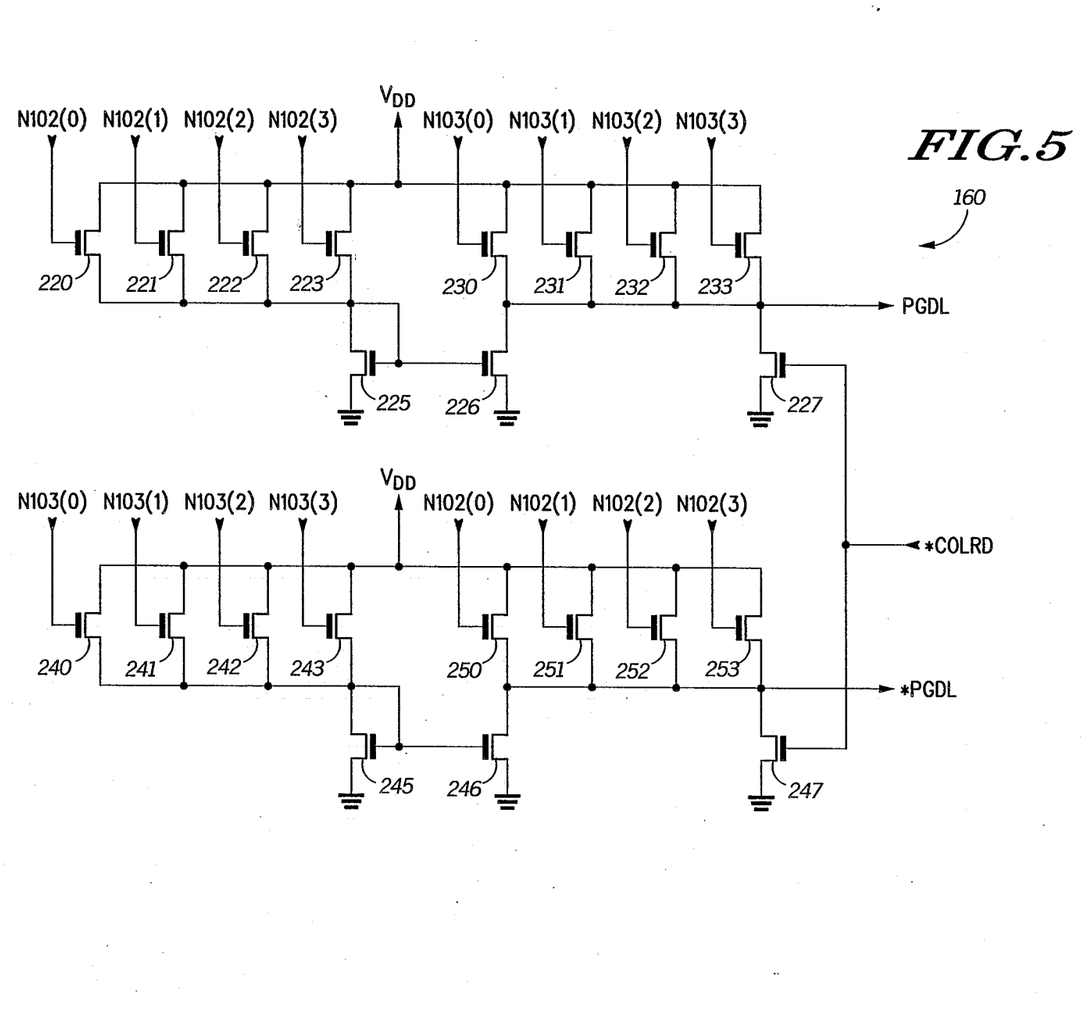
FIG. 5 shows a circuit diagram of a level shifter of the type contained in FIG. 3.

FIG. 5 shows a circuit diagram of level shifter 160. Level shifter 160 comprises N-channel transistors 220, 221, 222, 223, 225; N-channel transistors 227, 230, 231, 232, 233, and 226; N-channel transistors 240, 241, 242, 243, and 245; and N-channel transistors 247, 250, 251, 252, 253, and 246. Transistor 220 has a drain connected to $V_{DD}$, a gate for receiving signal N102(0), and a source. Transistor 221 has a drain connected to $V_{DD}$, a gate for receiving signal N102(1), and a source connected to the source of transistor 220. Transistor 222 has a drain connected to $V_{DD}$, a gate for receiving signal N102(2), and a source connected to the source of transistor 220. Transistor 223 has a drain connected to $V_{DD}$, a gate for receiving signal N102(3), and a source connected to the source of transistor 220. Transistor 225 has a drain connected to the source of transistor 220, a gate connected to the drain of transistor 225, and a source connected to $V_{SS}$.

Transistor 230 has a drain connected to $V_{DD}$, a gate for receiving signal N103(0), and a source for providing signal PGDL. Transistor 231 has a drain connected to $V_{DD}$, a gate for receiving signal N103(1), and a source connected to the source of transistor 230. Transistor 232 has a drain connected to $V_{DD}$, a gate for receiving signal N103(2), and a source connected to the source of transistor 230. Transistor 233 has a drain connected to $V_{DD}$, a gate for receiving signal N103(3), and a source connected to the source of transistor 230. Transistor 226 has a drain connected to the source of transistor 230, a gate connected to the gate of transistor 225, and a source connected to $V_{SS}$. Transistor 227 has a drain connected to the source of transistor 230, a gate connected to decoded column signal *COLRD, and a source connected to $V_{SS}$.

Transistor 240 has a drain connected to $V_{DD}$, agate for receiving signal N103(0), and a source. Transistor 241 has a drain connected to $V_{DD}$, a gate for receiving signal N103(1), and a source connected to the source of transistor 240. Transistor 242 has a drain connected to $V_{DD}$, a gate for receiving signal N103(2), and a source connected to the source of transistor 240. Transistor 243 has a drain connected to $V_{DD}$, a gate for receiving signal N103(3), and a source connected to the source of transistor 240. Transistor 245 has a drain connected to the source of transistor 240, a gate connected to the drain of transistor 245, and a source connected to $V_{SS}$.

Transistor 250 has a drain connected to $V_{DD}$, a gate for receiving signal N102(0), and a source for providing signal *PGDL. Transistor 251 has a drain connected to $V_{DD}$, a gate for receiving signal N102(1), and a source connected to the source of transistor 250. Transistor 252 has a drain connected to $V_{DD}$, a gate for receiving signal N102(2), and a source connected to the source of transistor 250. Transistor 253 has a drain connected to $V_{DD}$, a gate for receiving signal N102(3), and a source connected to the source of transistor 250. Transistor 246 has a drain connected to the source of transistor 250, a gate connected to the gate of transistor 245, and a source connected to $V_{SS}$. Transistor 247 has a drain connected to the source of transistor 250, a gate connected to *COLRD, and a source connected to $V_{SS}$.

In operation, decoded column signal *COLRD selects level shifter 160. When high, decoded column signal *COLRD turns on N-channel transistors 227 and 247 which drives pre-global data line signals PGDL and *PGDL to $V_{SS}$ and prevents PGDL and *PGDL from floating at inputs of transconductance amplifier 170. When low, decoded column signal *COLRD turns off N-channel transistors 227 and 247 and enables level shifter 160. Level shifter 160 receives amplified differential signal pairs N102(0)/N103(0)-N102(3)/N103(3), and level shifts them to a voltage more suitable for inputting to transconductance amplifier 170. Since only one of decoded column signals *COL0-*COL3 is active during a read access, only one pair of amplified differential signals N102(0)/N103(0)-N102(3)/N103(3) is active during a read access. Level shifting occurs due to an additional threshold drops of a transistor of a set of transistors 220-223, 230-233, 240-243, and 250-253. Additionally, amplification occurs due to current mirror action in transistors 225 and 226, and 245 and 246. In a preferred embodiment, transistor sizes transform a differential voltage on PGDL and *PGDL to approximately 1100 millivolts, and a common mode voltage to approximately one-half $V_{DD}$. Because level shifter 160 is configured as a source follower, an effective capacitance presented to differential amplifier 152 is very low and a drive capability at the output of level shifter 160 is large, both of which contribute to fast read accesses.

Level shifter 160 also overcomes the problem with using fast differential amplifier 152 by shifting the common mode voltage of the output from $V_{DD}$ minus one half of approximately 0.7 volts to approximately one half of $V_{DD}$. Level shifter 160 also introduces some amplification such that a differential voltage swing becomes approximately 1100 millivolts, instead of 700 millivolts. The combination of differential amplifier 152 and level shifter 160 has been shown to take a small signal on a bit line pair and amplify it with a voltage swing of 1100 millivolts and a common mode voltage of approximately one half $V_{DD}$. To complete the sensing function, however, bit line sense amplifier 122 must present signals on global data line pairs in a suitable fashion for outputting by multiplexer 14 of FIG. 1.

Figure 6:
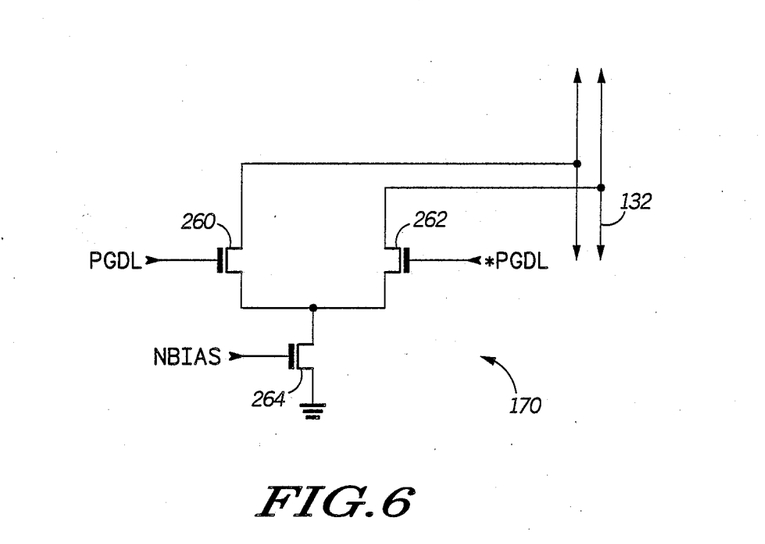
FIG. 6 contains a circuit diagram of a transconductance amplifier of the type contained in FIG. 3.

FIG. 6 shows a circuit diagram of transconductance amplifier 170. Transconductance amplifier 170 comprises an N-channel transistor 260, an N-channel transistor 262, and an N-channel transistor 264. Also shown in FIG. 6 is a pair of global data lines 132. Transistor 260 has a drain connected to a complementary global data line of global data line pair 132, a gate for receiving pre-global data line signal PGDL, and a source. Transistor 262 has a drain connected to a true line of global data line pair 132, a gate for receiving pre-global data line signal *PGDL, and a source connected to the source of transistor 260. Transistor 264 has a drain connected to the source of transistor 260, a gate for receiving biasing signal NBIAS, and a source connected to $V_{SS}$.

In operation, transconductance amplifier 170 receives a differential voltage from level shifter 160 on pre-global data line signals PGDL and *PGDL and converts the differential voltage into a differential current driven onto pair of global data lines 132. Transistor 264 is biased into a saturation region by biasing signal NBIAS, and functions as a current source. The differential signal on PGDL and *PGDL was amplified by level shifter 160 such that a differential component of the signal is approximately 1100 millivolts, which allows for a rapid switching of relatively large currents. In the preferred embodiment transconductance amplifier 170 switches approximately 2.5 milliamperes of current, which allows global data line pair 132 to be driven quickly. As part of a final sensing stage, a differential current on global data line pair 132 is converted to a differential voltage by global data line load sets 25 and 27 and buffered and output through multiplexer 14 as a set of four signals D0-D3.

The combination of differential amplifier, level shifter, and transconductance amplifier presents sensed bit line signals onto global data lines in a way that improves access time significantly over a prior art embodiment. Differential amplifier 152 amplifies a pair of data line signals, which reflect bit line signals for a selected pair of bit lines, quickly while presenting a differential signal with a high common-mode voltage to level shifter 160. Level shifter 160 receives the high common mode voltage and shifts it to a suitable level for final outputting, and amplifies the data line signal. Transconductance amplifier 170 receives the level-shifted signal and switches a differential current onto a pair of global data lines, where the differential current is then output.

By now it should be apparent that a memory has been provided which reduces access time by providing an improved apparatus for bit line sensing using non-address transition detection. A principle part of the apparatus comprises a differential amplifier, a level shifter, and a transconductance amplifier. The apparatus and a method for an improvement in bit line sensing has been described, and many variations are possible.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A memory comprising:
   a plurality of memory cells, each memory cell providing a pair of complementary bit line signals when selected;
   input means for receiving an address and selecting a memory cell in response thereto;
   an amplifier, coupled to the input means, for providing a pair of complementary amplified signals responsive to the pair of complementary bit line signals provided by the memory cell selected by the input means;
   a first transistor having a first current electrode for providing a first current signal, a control electrode for receiving a true amplified signal, and a second current electrode;
   a second transistor having a first current electrode for providing a second current signal, a control electrode for receiving a complementary amplified signal, and a second current electrode coupled to the second current electrode of the first transistor;
   a current source having a first terminal coupled to the second current electrode of the first transistor, and a second terminal coupled to a first power supply voltage terminal; and
   output means, for providing an output data signal external to the memory at a logic state representative of the differential current between the first current signal and the second current signal.

2. A memory as recited in claim 1 wherein said current source comprises a third transistor having a first current electrode coupled to the second current electrode of the first transistor, a control electrode for receiving a biasing signal, and a second current electrode coupled to the first power supply voltage terminal.

3. A memory comprising:
   a plurality of memory cells, each memory cell providing a pair of complementary bit line signals when selected;
   input means for receiving an address and selecting a memory cell in response thereto;
   a differential amplifier, coupled to the input means, for providing a pair of complementary amplified signals responsive to the complementary bit line signals provided by a memory cell selected by the input means;
   a level shifter, coupled to the differential amplifier, for providing a pair of complementary level-shifted signals responsive to the complementary amplified signals;
   a transconductance amplifer, coupled to the level shifter and having complementary outputs, for providing a differential current on said complementary outputs responsive to the complementary level-shifted signals; and
   output means, coupled to the transconductance amplifier, for providing an output data signal external to the memory at a logic state representative of the differential current at the outputs of the transconductance amplifier.

4. A memory having a plurality of bit line pairs and a plurality of word lines, comprising:
   a plurality of memory cells located at intersections of the plurality of bit line pairs and the plurality of word lines, each memory cell selected by an enabled word line and a selected bit line pair, and providing a pair of complementary bit line signals when selected;
   row decoding means coupled to the word lines for enabling a word line in response to a plurality of row address signals;
   column decoding means coupled to the bit line pairs for selecting a bit line pair in response to a plurality of column address signals;
   a differential amplifier, coupled to the column decoding means, for providing a pair of complementary amplified signals responsive to the pair of complementary signals on the bit line pair selected by the column decoding means;
   a level shifter, coupled to the differential amplifier, for providing a pair of complementary level-shifted signals responsive to the complementary amplified signals;
   a transconductance amplifier, coupled to the level shifter and having complementary outputs, for providing a differential current on said complementary outputs responsive to the complementary level-shifted signals; and
   output means, coupled to the transconductance amplifier, for providing an output data signal external to the memory at a logic state representative of the differential current at the outputs of the transconductance amplifier.

5. A memory having a plurality of bit line pairs and a plurality of word lines, comprising:
   a plurality of memory cells located at intersections of the plurality of bit line pairs and the plurality of word lines, each memory cell selected by an enabled word line and a selected bit line pair, and providing a pair of complementary bit line signals when selected;
   row decoding means coupled to the word lines for enabling a word line in response to a plurality of row address signals;
   a first column decoding means coupled to the bit line pairs for selecting a set of bit line pairs from the plurality of bit line pairs in response to a first plurality of column address signals;
   a plurality of differential amplifiers, coupled to the first column decoding means, for providing a plurality of pairs of complementary amplified signals, wherein each pair of complementary amplified signals is responsive to a pair of complementary signals on the set of bit line pairs selected by the first column decoding means;

a second column decoding means for selecting a pair of complementary amplified signals in response to a second plurality of column address signals;

a level shifter, coupled to the plurality of differential amplifiers, for providing a pair of complementary level-shifted signals responsive to the selected pair of complementary amplified signals; and output means, coupled to the level shifter, for providing an output data signal external to the memory at a logic state representative of the pair of complementary level-shifted signals provided by the level shifter.

6. The memory of claim 5 wherein each of said plurality of differential amplifiers comprises:

a first transistor having a first current electrode coupled to a first power supply voltage terminal, a control electrode for receiving a first column signal, and a second current electrode;

a second transistor having a first current electrode coupled to the first power supply voltage terminal, a control electrode for receiving the first column signal, and a second current electrode;

a third transistor having a first current electrode coupled to the second current electrode of the first transistor, a control electrode for receiving the first column signal, and a second current electrode coupled to a second power supply voltage terminal;

a fourth transistor having a first current electrode coupled to the second current electrode of the second transistor, a control electrode for receiving the first column signal, and a second current electrode coupled to the second power supply voltage terminal;

a fifth transistor having a first current electrode coupled to the second current electrode of the first transistor, a control electrode for receiving a first input signal, and a second current electrode;

a sixth transistor having a first current electrode coupled to the second current electrode of the second transistor, a control electrode for receiving a complement of the first input signal, and a second current electrode coupled to the second current electrode of the fifth transistor; and a seventh transistor having a first current electrode coupled to the second current electrode of the fifth transistor, a control electrode for receiving a biasing signal, and a second current electrode coupled to the second power supply voltage terminal.

7. The memory of claim 5, wherein said plurality of differential amplifiers is further characterized as comprising four differential amplifiers.

8. The memory as recited in claim 5, wherein said output means comprises:

a transconductance amplifier, coupled to the level shifter and having complementary outputs, for providing a differential current on said complementary outputs responsive to the complementary level-shifted signals; and data buffering means, coupled to the transconductance amplifier, for providing an output data signal external to the memory at a logic state representative of the differential current at the outputs of the transconductance amplifier.

9. The memory of claim 8 wherein said transconductance amplifier comprises:

a first transistor having a first current electrode coupled to said output means, a control electrode for receiving a level-shifted signal, and a second current electrode;

a second transistor having a first current electrode coupled to said output means, a control electrode for receiving a complement of the level-shifted signal, and a second current electrode coupled to the second current electrode of the first transistor; and a third transistor having a first current electrode coupled to the second current electrode of the first transistor, a control electrode coupled to the biasing signal, and a second current electrode coupled to a second power supply voltage terminal.

10. In a memory comprising a plurality of memory cells located at the intersections of bit line pairs and word lines, each memory cell selected by an enabled word line and a selected bit line pair, and providing a pair of complementary bit line signals when selected, row decoding means coupled to the word lines enabling a word line in response to a plurality of row address signals, column decoding means coupled to the bit line pairs for selecting a bit line pair in response to a plurality of column address signals, and output means taking signals on a pair of global data lines and outputting a data signal in response, a method for sensing data comprising the steps of:

amplifying the complementary bit line signals differentially to produce a pair of amplified signals;

level-shifting the amplified signals to produce a pair of level-shifted signals;

converting the level-shifted signals into a differential current; and providing the differential current on the global data line pair.

* * * * *